US012773906B2

(12) United States Patent
Vallender et al.

(10) Patent No.: US 12,773,906 B2
(45) Date of Patent: Oct. 27, 2026

(54) POWER SYSTEM INCLUDING INDEPENDENT POWER GRIDS

(71) Applicant: GM GLOBAL TECHNOLOGY OPERATIONS LLC, Detroit, MI (US)

(72) Inventors: Joshua Aaron Vallender, Farmington, MI (US); Robert A. De Stefano, Macomb Township, MI (US); Daniel Pinheiro Carlesimo, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 19/008,218

(22) Filed: Jan. 2, 2025

(65) Prior Publication Data

US 2026/0184181 A1 Jul. 2, 2026

(51) Int. Cl.

*B60L 1/00* (2006.01)
*B60L 3/00* (2019.01)
*B60L 3/04* (2006.01)
*G01R 31/66* (2020.01)
*H01M 50/249* (2021.01)
*H01M 50/574* (2021.01)
*H02H 7/22* (2006.01)
*H02J 1/08* (2006.01)

(52) U.S. Cl.

CPC ............... *B60L 3/0069* (2013.01); *B60L 1/00* (2013.01); *B60L 3/04* (2013.01); *G01R 31/66* (2020.01); *H01M 50/249* (2021.01); *H01M 50/574* (2021.01); *H02J 1/084* (2020.01); *H02J 1/086* (2020.01); *H01M 2220/20* (2013.01); *H02H 7/22* (2013.01)

(58) Field of Classification Search

CPC .... B60L 1/00; B60L 1/003; B60L 1/14; B60L 3/0069; B60L 3/04; G01R 31/66; H01M 50/249; H01M 50/574; H01M 2220/20; H02H 7/22; H02J 1/084; H02J 1/086; H02J 1/14; H02J 1/15

See application file for complete search history.

(56) References Cited

U.S. PATENT DOCUMENTS

| | | | | |
|---|---|---|---|---|
| 6,340,848 B1 * | 1/2002 | Maeda | H02J 1/00 | 307/10.1 |
| 2001/0035685 A1 * | 11/2001 | Tamai | H02J 7/1423 | 307/10.1 |
| 2011/0115287 A1 * | 5/2011 | Morita | B60L 50/16 | 307/9.1 |
| 2017/0317515 A1 * | 11/2017 | Satake | H02J 7/865 | |
| 2018/0222411 A1 * | 8/2018 | Aoki | B60L 58/12 | |
| 2018/0334037 A1 * | 11/2018 | Masui | B60L 3/04 | |
| 2021/0132645 A1 * | 5/2021 | Sato | G05F 1/577 | |
| 2021/0249895 A1 * | 8/2021 | Terada | H02J 1/086 | |

(Continued)

*Primary Examiner* — Levi Gannon

(74) *Attorney, Agent, or Firm* — CANTOR COLBURN LLP

(57) ABSTRACT

A power system includes a first power grid configured to supply power to a first component from a low voltage battery of a vehicle, a second power grid configured to supply power to a second component from the low voltage battery, and a grid isolation system including at least one current interrupting device and a controller configured to operate the current interrupting device to selectively isolate at least one of the first power grid and the second power grid from the low voltage battery.

20 Claims, 9 Drawing Sheets

(56) References Cited

U.S. PATENT DOCUMENTS

| | | | | |
|---|---|---|---|---|
| 2021/0288508 | A1* | 9/2021 | Sekiguchi | H01M 10/48 |
| 2023/0077522 | A1* | 3/2023 | Takahashi | B60R 16/033<br>307/10.1 |
| 2023/0198290 | A1* | 6/2023 | Kobayashi | H02J 1/10<br>307/23 |
| 2023/0318350 | A1* | 10/2023 | Motofusa | H02J 9/061<br>307/11 |
| 2025/0202229 | A1* | 6/2025 | Masui | H02J 1/00 |

* cited by examiner

POWER SYSTEM INCLUDING INDEPENDENT POWER GRIDS

INTRODUCTION

The subject disclosure relates to electrical systems, and more particularly to vehicle electrical system or other systems having independent power grids.

Vehicles, including gasoline and diesel powered vehicles, as well as electric and hybrid electric vehicles, feature battery storage for purposes such as powering electric motors, electronics and other vehicle subsystems. Various battery assemblies may be included to provide power to a wide range of loads. For example, electric and hybrid vehicles include high voltage battery assemblies for powering high voltage loads (e.g., motors) and low voltage battery assemblies for powering low voltage loads (e.g., electronics, lighting, etc.).

SUMMARY

In one exemplary embodiment, a power system includes a first power grid configured to supply power to a first component from a low voltage battery of a vehicle, a second power grid configured to supply power to a second component from the low voltage battery, and a grid isolation system including at least one current interrupting device and a controller configured to operate the current interrupting device to selectively isolate at least one of the first power grid and the second power grid from the low voltage battery.

In addition to one or more of the features described herein, the low voltage battery, the first power grid and the second power grid are part of a vehicle.

In addition to one or more of the features described herein, the low voltage battery is part of a battery module including a housing, the at least one current interrupting device disposed in the housing.

In addition to one or more of the features described herein, the at least one current interrupting device includes at least one of a first switch configured to selectively connect the low voltage battery to the first power grid, and a second switch configured to selectively connect the low voltage battery to the second power grid.

In addition to one or more of the features described herein, the at least one current interrupting device includes the first switch and the second switch.

In addition to one or more of the features described herein, the grid isolation system includes a protection switch disposed between the low voltage battery and the at least one current interrupting device. The protection switch is configured to be opened to disconnect the low voltage battery from the first power grid and the second power grid.

In addition to one or more of the features described herein, the at least one current interrupting device includes at least one of a first switch disposed between the protection switch and the first power grid, and a second switch disposed between the protection switch and the second power grid.

In addition to one or more of the features described herein, the at least one current interrupting device includes a first switch configured to selectively connect the low voltage battery to the first power grid or the second power grid, and the power system includes a fuse system including a first fuse operable to disconnect the first power grid from the first switch and the low voltage battery, and a second fuse operable to disconnect the second power grid from the low voltage battery.

In another exemplary embodiment, a method of evaluating a power system includes activating the power system by electrically connecting a low voltage battery to a first power grid and a second power grid, the power system having a grid isolation system that includes at least one current interrupting device and a controller configured to operate the current interrupting device to selectively isolate at least one of the first power grid and the second power grid from the low voltage battery. The method also includes acquiring a low voltage electrical component and connecting the electrical component to the first power grid, where a fuse is disposed between the low voltage electrical component and the first power grid, and testing an electrical connection between the electrical component and the low voltage battery.

In addition to one or more of the features described herein, the grid isolation system includes a protection switch disposed between the low voltage battery and the at least one current interrupting device, the protection switch configured to be opened to disconnect the low voltage battery from the first power grid and the second power grid.

In addition to one or more of the features described herein, the method further includes determining whether the electrical component is a high current component or a low current component.

In addition to one or more of the features described herein, the method further includes, based on the electrical component being a high current component, operating the current interrupting device to isolate the first power grid from the low voltage battery and the second power grid prior to connecting the electrical component to the first power grid.

In addition to one or more of the features described herein, the power system includes a high voltage power module connected to a high voltage power source, the high voltage power module selectively connectable to the second power grid and the controller by the at least one current interrupting device.

In addition to one or more of the features described herein, the method further includes, based on the electrical component being a high current component, closing the protection switch, or maintaining the protection switch in a closed position.

In addition to one or more of the features described herein, the method further includes, prior to connecting the electrical component to the first power grid, opening the current interrupting device to isolate the first power grid from the low voltage battery and the second power grid, wherein the high voltage power module provides electrical power to the second power grid during the connecting.

In addition to one or more of the features described herein, the low voltage battery, the first power grid and the second power grid are part of a vehicle.

In yet another exemplary embodiment, a vehicle system includes a low voltage battery configured to power electrical components of a vehicle, a first power grid configured to supply power to a first component from the low voltage battery, a second power grid configured to supply power to a second component from the low voltage battery, and a grid isolation system including at least one current interrupting device and a controller configured to operate the current interrupting device to selectively isolate at least one of the first power grid and the second power grid from the low voltage battery.

In addition to one or more of the features described herein, the low voltage battery is part of a battery module including a housing, the at least one current interrupting device disposed in the housing.

In addition to one or more of the features described herein, the at least one current interrupting device includes at least one of a first switch configured to selectively connect the low voltage battery to the first power grid, and a second switch configured to selectively connect the low voltage battery to the second power grid.

In addition to one or more of the features described herein, the grid isolation system includes a protection switch disposed between the low voltage battery and the at least one current interrupting device, the protection switch configured to be opened to disconnect the low voltage battery from the first power grid and the second power grid.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
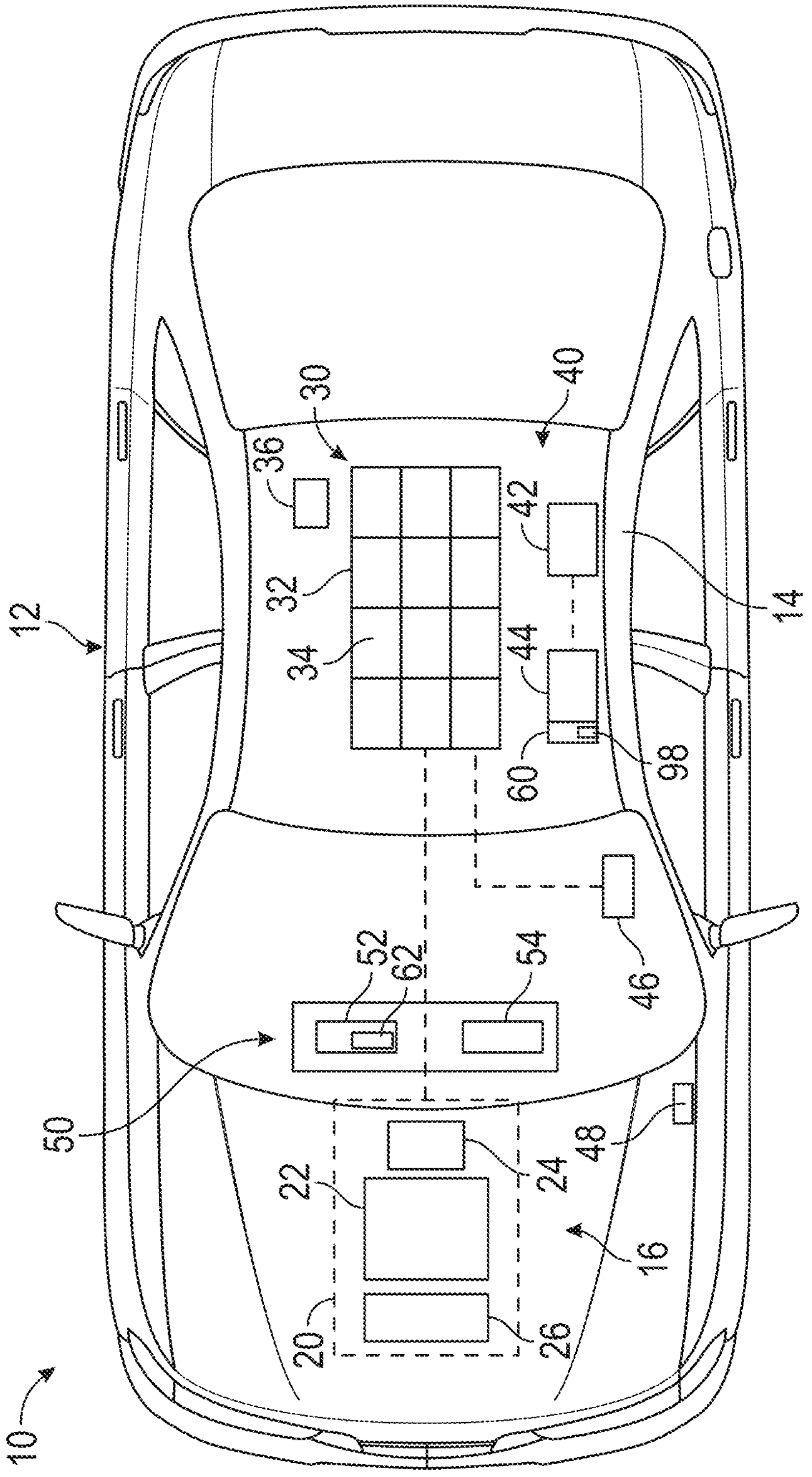
FIG. 1 is a top schematic view of a motor vehicle including high voltage and low voltage battery systems, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for controlling an electrical system, such as a power system of a vehicle. In an embodiment, the power system is a low voltage power system, such as a low voltage electrical system in a vehicle.

An embodiment of a low voltage power system includes a low voltage power source, such as a battery pack (e.g., 12 V battery pack), which is selectively connectable to at least two independent power grids. Embodiments are not so limited, as the power source can be any suitable power source or storage device.

The low voltage power system includes a grid isolation system configured to allow each power grid to be individually disconnected from the low voltage power source. The grid isolation system includes a switching assembly for selectively connecting one or more power grids. All or part of the switching assembly may be part of a battery pack or battery module.

In an embodiment, the low voltage power system includes at least two separate power sources. For example, the power system includes a low voltage battery pack, and a conversion device (e.g., an accessory power module (APM)) for converting high voltage power from a vehicle's high voltage battery pack. One of the power sources may be used to power a controller and/or other components when a power grid is disconnected from the low voltage battery pack. It is noted that embodiments may include any combination of power sources (e.g., batteries, capacitor and DC/DC converters).

Embodiments also include methods of using a low voltage power system in conjunction with testing and/or manufacturing an electrical system or components thereof, for a vehicle or for any suitable system or context. The methods include, for example, a testing method that uses a vehicle system or other low voltage power system as a testing device. The methods also include methods for connecting electrical components (e.g., as part of a manufacturing process, repair process or a process in which new components are added to an existing system).

Embodiments described herein present numerous advantages and technical effects. Embodiments provide effective methods for low voltage power control and distribution, as well as improved methods of testing, assembly and manufacturing.

Existing vehicles that utilize multiple independent power sources connect such power sources to a single grid, and feature an external isolation switch connecting both grids. Embodiments described herein allow for less complex systems that require fewer components and resources, as well as improve the ability to perform testing (e.g., via vehicle as a testing device (VaaT) in a manufacturing environment). In addition, embodiments improve the availability of power in case of grid failure, and can be scaled up to provide fail-operational power. For example, embodiments include redundant grids with a minimal reaction time allowing for isolation of a faulty grid and/or diagnostic capability.

Design solutions can be realized that include fewer components (or components that require less resources) than existing vehicles. For example, external grid isolation can be excluded, allowing for the use of thermal fuses for wiring protection. In addition, dual grid systems can be provided that do not require multiple power sources (e.g., separate batteries) to power different grids, allowing for fewer batteries. As a result, embodiments described herein can provide significant savings in resources, mass and packaging space.

The embodiments are not limited for use with any specific vehicle or device or system that utilizes battery assemblies, and may be applicable to various contexts. For example, embodiments may be used with automobiles, trucks, aircraft, construction equipment, farm equipment, automated factory equipment and/or any other device or system that may use high voltage battery packs or other battery assemblies.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, and if the vehicle is a hybrid electric vehicle, a fuel injection subsystem, an exhaust subsystem and others.

The vehicle 10 may be an electrically powered vehicle (EV), a hybrid vehicle or any other vehicle. In an embodiment, the vehicle 10 is an electric vehicle, which includes one or more electric motors and one or more drive systems. For example, the propulsion system 16 includes a drive unit 20 having an electric motor 22 and an inverter 24, as well as other components such as a cooling system 26. The inverter 24 (e.g., traction power inverter unit or TPIM) converts direct current (DC) power from a high voltage (HV) battery system 30 to poly-phase (e.g., two-phase, three-phase, six-phase, etc.) alternating current (AC) power to drive the motor 22. The battery system 30 may be configured as a rechargeable energy storage system (RESS).

The HV battery system 30 includes one or more battery assemblies. For example, the HV battery system 30 includes a high voltage (e.g., 400 V or 800 V) battery pack 32 connected to the inverter 24. The battery pack 32 includes a plurality of battery modules 34, and each module 34 includes a number of individual cells (not shown). The HV battery system 30 may include various sensors readable by a monitoring device such as a RESS controller 36.

The vehicle 10 includes at least one low voltage (LV) power system 40 including a LV battery module 42 (e.g., a 12 Volt (V) battery pack). The LV battery module 42 has a lower voltage rating than the HV battery pack 32. The voltage of the LV battery module 42 may be 12 V, 48 V or any other suitable voltage. The LV battery module 42 may also be a variable voltage battery system.

It is noted that the terms "high voltage" and "low voltage" are relative terms. Accordingly, these terms are not intended to limit the HV battery system 30 or the LV battery module 42 to any specific voltage rating.

Aspects of power transfer are controlled via a control device such as an accessory power module (APM) 44. Power transfer includes discharging the LV battery module 42, for example, to power electronics and other components of the vehicle 10. The APM 44 converts high voltage from the HV battery pack 32 (while maintaining electrical isolation between the HV battery pack 32 and low voltage components), to power low voltage components and/or charge the LV battery module 42.

The LV power system 40 is used to power various components during vehicle modes or states. For example, when the vehicle 10 is on and/or in propulsion mode, the APM 44 acts as the main power source for vehicle controllers, power windows, power locks, lighting and/or other LV components. The APM 44 also acts to maintain a state of charge of the LV battery module 42. In the propulsion mode, the LV battery module 42 acts as a voltage stabilizer, supplies extra power when a load exceeds the APM 44 capacity, and prevents voltage spikes or transients from affecting components of the LV power system 40. If the vehicle 10 is a combustion engine vehicle, a generator may be included to perform functions similar to the APM 44.

When the vehicle 10 is off (in an "off power" mode), the APM 44 supplies power to all or selected vehicle controllers, so that certain vehicle functions are maintained. Moreover, the LV battery module 42 may leverage an internal grid isolation switch (e.g., switch S3 of FIGS. 2-6) to disengage itself from power grids (e.g., power grids 70 and 80 of FIG. 2) during off power mode, preserving the LV battery module's state of charge and enabling the LV power system 40 to operate with a lowered voltage setpoint to minimize parasitic drain. The LV battery module 42 may also provide power to off-power mode functions in case the APM 44 is not available.

The vehicle 10 also includes a charging system, which includes a charging control device 46, such as an onboard charging module (OBCM). The charging control device 46 connects the battery system 30 to a charge port 48.

The vehicle 10 also includes a computer system 50 that includes one or more processing devices 52 and a user interface 54. The computer system 50 may communicate with other controllers, for example, to provide commands thereto in response to a user input. The various processing devices, modules and units may communicate with one another via a communication device or system, such as a controller area network (CAN) or transmission control protocol (TCP) bus.

In an embodiment, the vehicle 10 includes two or more independent power grids. A "power grid" refers to a system or network that distributes electrical power to various electrical components in the vehicle 10. Each power grid is internal to the vehicle 10.

In an embodiment, the LV battery module 42 includes or is connected to a grid isolation system 60 that includes at least one isolation switch (e.g., at least one of switches S1, S2 and S3 shown in FIG. 2), The grid isolation system 60 (or components thereof) is controllable by a controller 62, which may be part of the one or more processing devices 52 or otherwise includes any suitable processor or processors. In an embodiment, the controller 62 is configured to communicate with a switch controller 98 for selective isolation of each power grid from the LV battery module 42. In this way, at least two power grids can be independently controlled.

Figure 2:
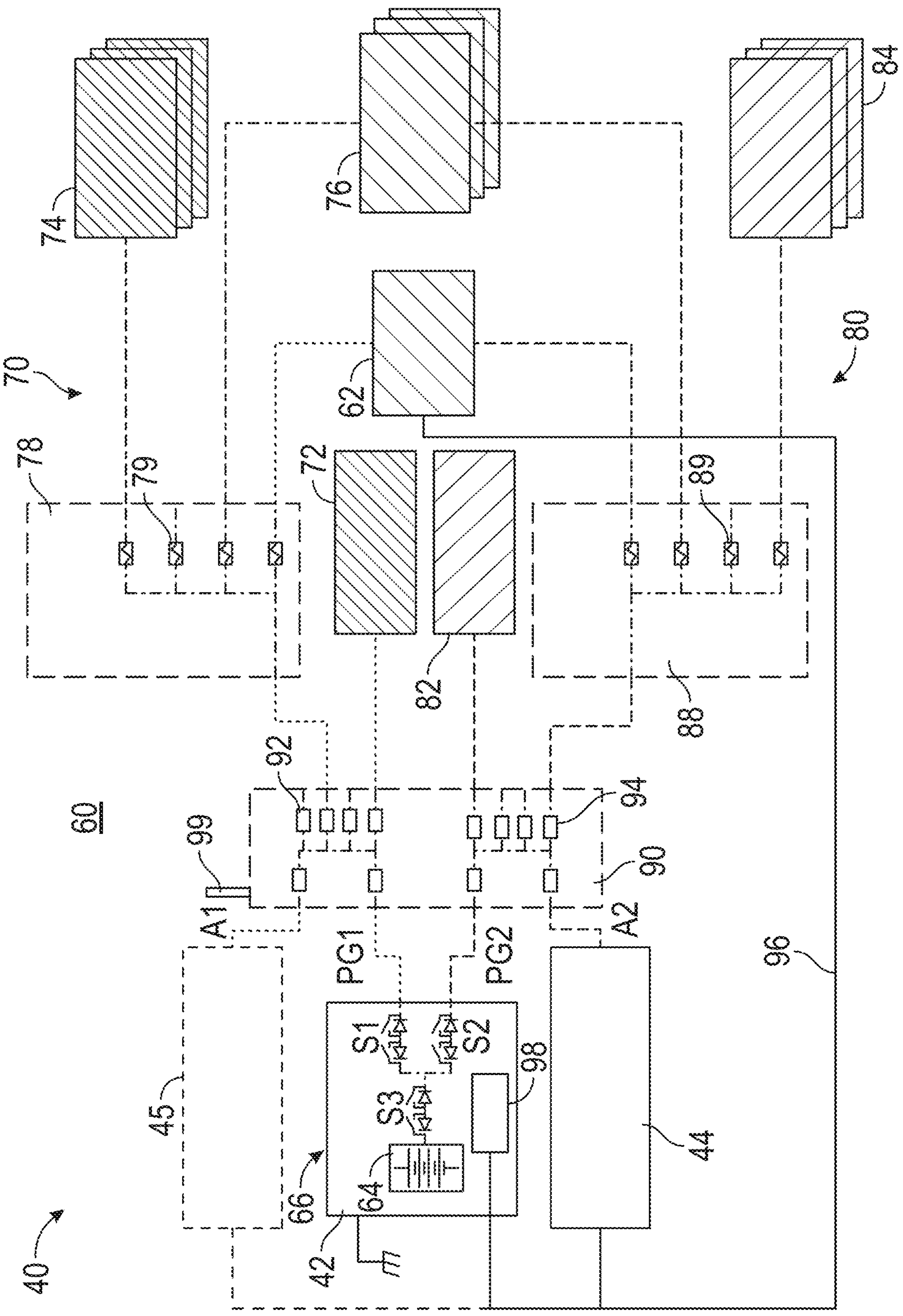
FIG. 2 schematically depicts a dual grid low voltage power system including a grid isolation system, in accordance with an exemplary embodiment.

FIG. 2 depicts an embodiment of the LV power system 40. The LV battery module 42 houses a set of battery cells 64, which may be Lithium-ion, lead-acid or any other suitable type of battery cells. The grid isolation system 60 includes a switching assembly 66 that includes one or more switches for selectively connecting the battery cells 64 to the power system 40 and/or for selectively connecting the battery cells 64 to one or more power grids. Although the switching assembly 66 is shown as being part of the LV battery module 42, embodiments are not so limited, as one or more of the switches in the switching assembly 66 may be external to the LV battery module 42.

The LV power system 40 includes two independent power grids, including a first power grid 70 (Grid A) and second power grid 80 (Grid B). The power grids 70 and 80 are independent, in that each power grid 70,80 can be separately activated, and the power grids 70 and 80 can be isolated from each other by using the switching assembly 66. For example, the LV battery module is a 12 V or 48 V battery, supplying 12V or 48 V power to connected components.

The first power grid 70 connects the battery module 42 via the switching assembly 66 to a first set of components, which include high current components 72 and mid/low current components. The mid/low current components include one or more single input components 74 and one or more dual input components 76. The single input components are connected to only one of the power grids, whereas the dual input components 76 are connected to both power grids 70 and 80. The mid/low current components are connected to an electrical center 78 that includes a set of mid/low current circuit protection devices 79, such as fuses (e.g., mini-fuses) or e-fuses (e.g., semiconductors supporting reconfigurable current-time open behavior to replace traditional fuses, and/or solid state switches instead of traditional relays).

The second power grid 80 connects the battery module 42 via the switching assembly 66 to a second set of components, which include high current components 82 and mid/low current components. The mid/low current components include one or more single input components 84 and one or more of the dual input components 76. The mid/low current components are connected to an electrical center 88 that includes a set of mid/low current protection devices, such as mid/low current fuses 89.

"Mid/low" current components are components such as lights, controllers, door locks, which require a relatively low current, referred to as a mid/low current. A "mid/low current" is a current that is less than or equal to a threshold current. "High current" components are components such as compressors, cooling fans, active suspensions, braking systems and power steering systems, which require a current amplitude that is greater than the threshold current. For example, the threshold current is 60 Amps (A) for some vehicle distribution centers (i.e., high current is greater than 60 A).

The grid isolation system 60, in an embodiment, includes a prefuse center 90, which includes a set of high current fuses (e.g., thermal fuses such as MEGA®-fuses or Masterfuses®) for each grid. For example, the prefuse center 90 includes a first set of high current fuses 92 operable to interrupt excessive currents in the first power grid 70. Likewise, the prefuse center 90 includes a second set of high current fuses 94 for the second power grid 80. The fuses may be thermal fuses, e-fuses or others.

The prefuse center 90 may include an exposed post 99 that provides a positive terminal. The post 99 may be used during manufacture or assembly to provide power to controllers and/or other electronics, and/or to provide power for testing.

The grid isolation system 60 also includes a communication network, such as a serial data network (CAN, LIN, Ethernet, etc.), for allowing the controller 62 to monitor the battery module 42 and the APM 44, and to control operation of the switching assembly 66. For example, the controller 62 is connected via a communication cable 96 to the APM 44 and the battery module 42, and to the switch controller 98 that operates the switching assembly 66 (e.g., in response to commands from the controller 62 or other processor).

The LV power system 40 may include the APM 44 as shown, which is connectable to the power grid 80. Alternatively, or additionally, the LV power system 40 may include an APM 45 connectable to the power grid 70 in order to satisfy fail-operational power requirements, when needed or desired.

The LV battery module 42 may be used to supply power to one power grid 70,80 while another power grid 70,80 is disconnected from the LV battery module 42. This is useful, for example, during manufacturing and/or assembly, to allow the controller 62 to receive power. If the battery module 42 is not yet installed, the APM 44 may be used to supply power to the power grid 80 and/or the APM 45 may be used to supply power to the power grid 70.

The switching assembly 66 includes one or more switches for connecting and disconnecting a power source from the power grid 70, the power grid 80 or both. For example, the LV battery module 42 houses three internal switches S1, S2 and S3. The switches are shown as bidirectional field-effect transistors (FETs). The switches S1, S2 and/or S3 may be configured to achieve a minimum reaction time to isolate a faulty grid, and/or to provide diagnostic capability.

Any suitable device may be employed as a switch. For example, the switches can include solid state relays and transistors such as Silicon (Si) insulated gate bipolar transistors (IGBTs), and field-effect transistors (FETs). Examples of FETs include metal-oxide-semiconductor FETs (MOSFETs), Si MOSFETs, silicon carbide (SiC) MOSFETs, gallium nitride (GaN) high electron mobility transistors (HEMTs), and SiC junction-gate FETs (JFETs). Other examples of switches that can be used include diamond, gallium oxide and other wide band gap (WBG) semiconductor-based power switch devices.

The switch S1 is connected between the switch S3 (or directly connected to the battery cells 64 if no switch S3 is present) and the power grid 70 via a conductor PG1. Likewise, the switch S2 is connected between the switch S3 (or directly connected to the battery cells 64 if no switch S3 is present) and the power grid 80 via a conductor PG2. The switch S1 may be used to disconnect the battery cells 64 from the power grid 70 and isolate the power grid 70 from the power grid 80, and the switch S2 may be used to disconnect the power grid 80 from the battery cells 64 and isolate the power grid 80 from the power grid 70.

The switch S3 is operable to connect and disconnect both power grids 70 and 80 to and from the battery cells 64. The switch S3 can be used to stop providing power to both the power grid 70 and the power grid 80. The switch S3 may also be used to protect the battery cells 64 from over-voltage and/or damage.

The switch S3 may be used to disconnect the LV battery module 42 from the power grids 70 and 80 during an off power mode, so that components of the vehicle 10 can operate with a reduced voltage setpoint to reduce parasitics. The switches S1 and S2 can be used to perform this function if the switch S3 is not present.

The number and type of switches in the switching assembly 66 is not limited to the configuration of FIG. 2. The number of switches in the switching assembly 66, and locations of various switches can vary, for example, depending on design considerations, system requirements for isolation, battery availability and functionality. For example, the number of switches in the switching assembly 66 may be selected based on levels of protection and integrity desired.

FIGS. 3-6 depict embodiments of the switching assembly 66, which include different combinations of switches. The switches in these embodiments are shown as mechanical contactors. The embodiments are not so limited, as any type of switch or current interrupting device may be used. As shown, the switch S2 is connectable to the power grid 70 via the output conductor PG1, and the switch S3 is connectable to the power grid 80 via the output conductor PG2. G1 represents the LV battery ground.

Figure 3:
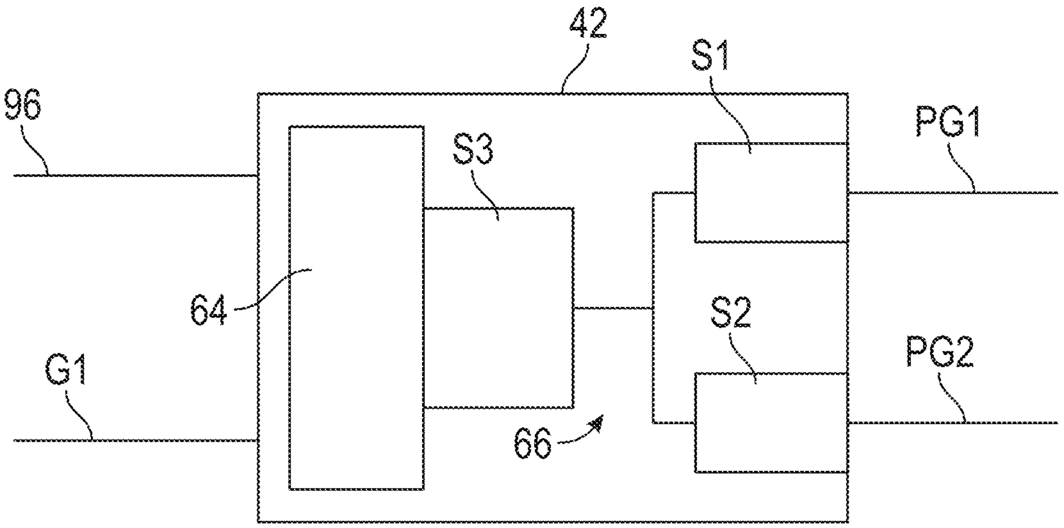
FIG. 3 depicts a battery module including a switching assembly for selectively connecting a battery to one or more power grids, in accordance with an exemplary embodiment.
Figure 4:
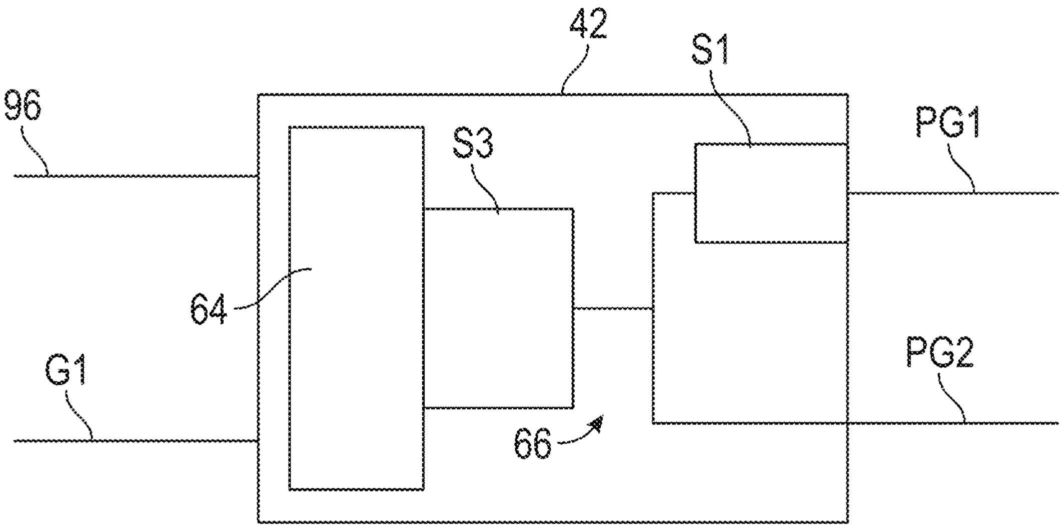
FIG. 4 depicts a battery module including a switching assembly for selectively connecting a battery to one or more power grids, in accordance with an exemplary embodiment.
Figure 5:
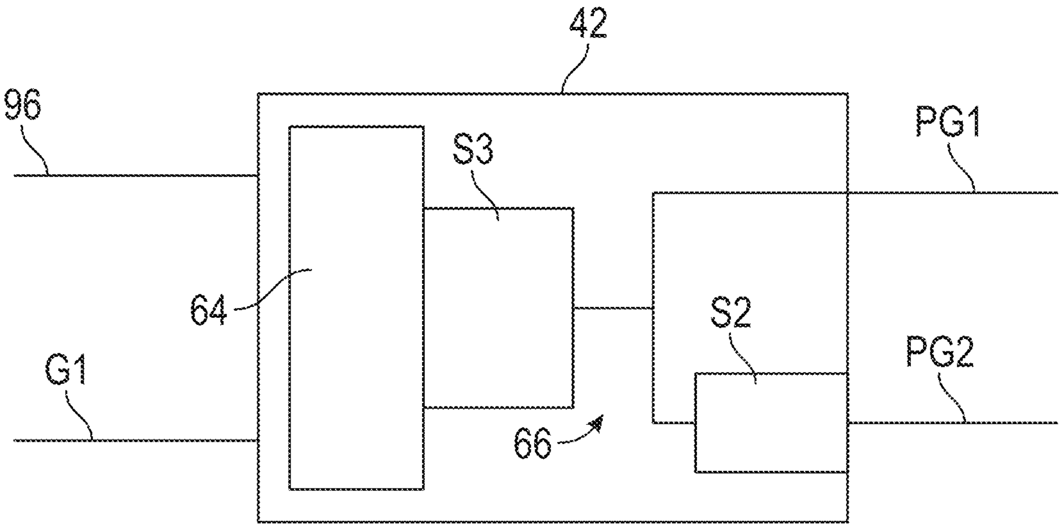
FIG. 5 depicts a battery module including a switching assembly for selectively connecting a battery to one or more power grids, in accordance with an exemplary embodiment.

In the embodiment of FIG. 3, the switching assembly 66 includes all of the switches S1, S2 and S3. FIG. 4 shows an embodiment in which the switching assembly 66 includes only the switches S1 and S3 (the conductor PG2 is directly connected to the switch S3), and FIG. 5 shows an embodiment in which the switching assembly 66 includes only the switches S2 and S3 (the conductor PG1 is directly connected to the switch S3). In each of these embodiments (FIGS. 3-5), the power grids 70 and 80 can be isolated from each other by opening one or more of the switches S1, S2 and S3. In addition, the battery cells 64 can be disconnected while connection between the power grids 70 and 80 is maintained (by opening the switch S3 and keeping the remaining switch(es) closed).

Figure 6:
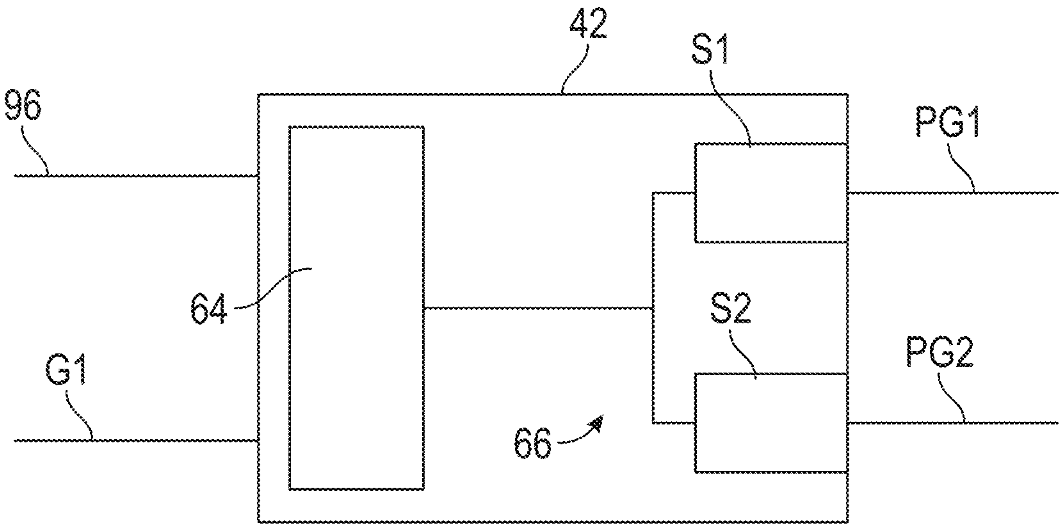
FIG. 6 depicts a battery module including a switching assembly for selectively connecting a battery to one or more power grids, in accordance with an exemplary embodiment.

FIG. 6 depicts an embodiment in which the switching assembly 66 includes the switches S1 and S2, which are directly connected to the battery cells 64. The switch S3 is excluded.

The LV power system 40 is configured to be used in various methods. For example, the power system 40 is used during vehicle operation to regulate power distribution, and to control the switching assembly to respond to events by isolating one or more power grids. Other methods include methods for testing electrical components, and manufacturing or assembly methods.

Figure 7A:
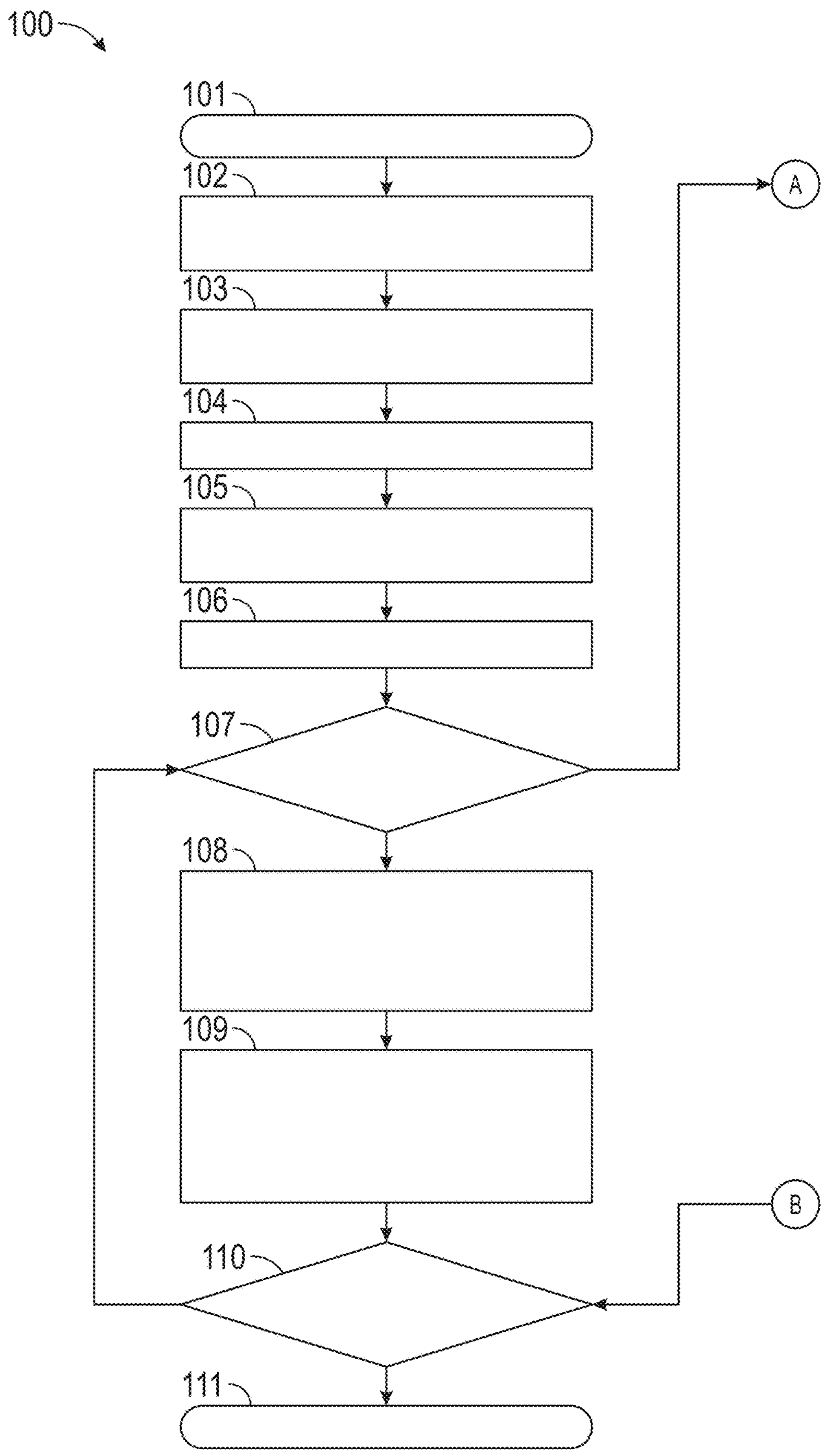
FIGS. 7A-7C depict a flow diagram depicting aspects of a method of testing and/or manufacturing an electrical system, or a method of controlling power to the electrical system during testing and/or manufacturing, in accordance with an exemplary embodiment.
Figure 7B:
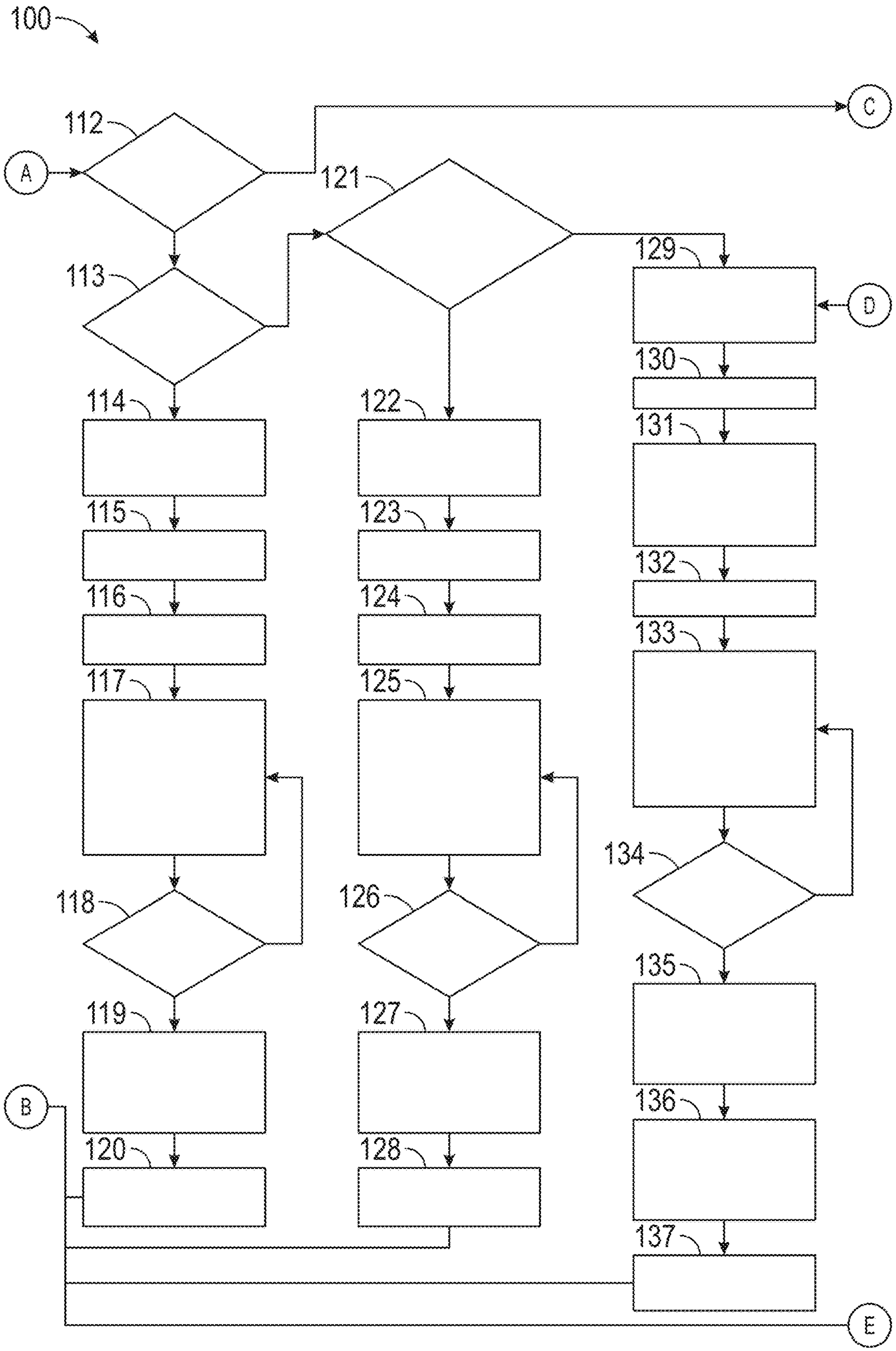
Figure 7C:
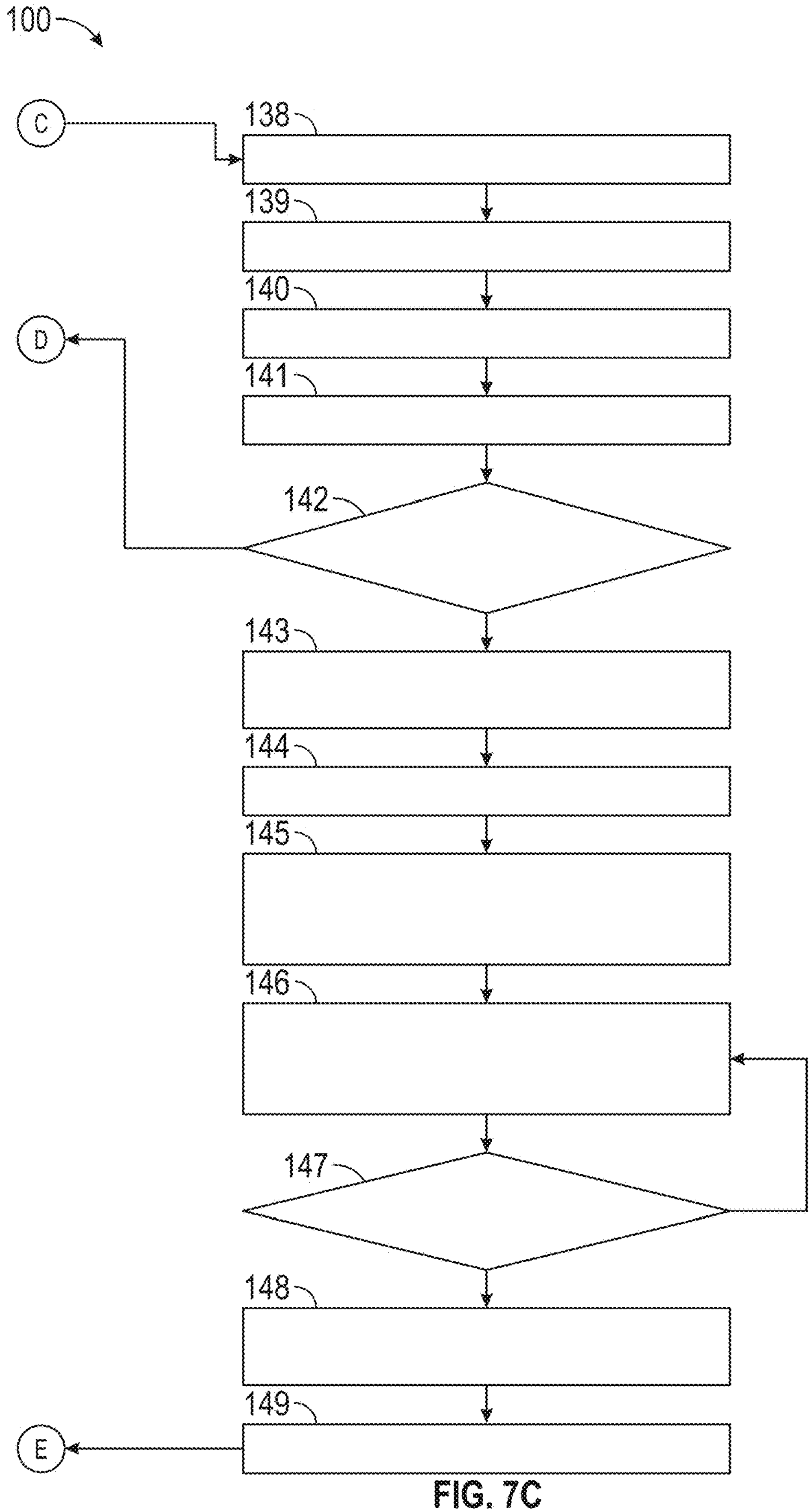

FIGS. 7A, 7B and 7C depict embodiments of a method 100 of testing and/or manufacturing a power system, or of controlling an electrical system in conjunction with testing and/or manufacturing. In an embodiment, the method is performed with respect to a low voltage battery system (e.g., 12 V, 48 V, etc.). The power system may be an electric, hybrid or combustion vehicle power system, or may be any suitable power system that includes at least two separate power grids.

The method 100 includes a number of steps or stages represented by blocks 101-149. The method 100 is not limited to the number or order of steps therein, as some steps represented by blocks 101-149 may be performed in a different order than that described below, or fewer than all of the steps may be performed.

The method 100 is described in conjunction with the controller 62 of FIGS. 1 and 2, but is not so limited. The method 100 may be performed by any suitable processing device or combination of processing device. In addition, the method 100 is described in conjunction with the power system of FIG. 2 for illustration purposes, but is not so limited.

The method 100 is described in conjunction with an embodiment of the LV power system 40, in which the LV power system 40 has one APM 44 (the APM 45 is excluded). However, the method 100 is not so limited, and may be performed similarly if both the APM 44 and the APM 45 are present.

Referring to FIG. 7A, at block 101, a low voltage power system assembly process begins. This assembly process utilizes a testing algorithm, such as a vehicle-as-a-tester (VaaT) algorithm to evaluate electrical connections during the assembly process.

At block 102, the battery module 42, the switching assembly 66 (including the switches S1, S2 and/or S3 and appropriate busbars or other connections), the prefuse center 90 and connecting conductors PG1 and PG2 are installed. The battery module 42 may house the switches S1, S2 and/or S3 (e.g., according to one of the embodiments of FIGS. 3-6), or one or more of the switches may be external.

At block 103, the prefuse center 90 is activated by electrically connecting the prefuse center 90 to a positive terminal of the battery module 42. At this point, all of the switches in the switching assembly 66 are closed (block 104).

At block 105, power from the battery cells 64 is supplied to a control device or processor. For example, the battery module 42 is connected to a central computer or to the controller 62 via the electrical centers 78 and 88.

At block 106, a testing algorithm such as a VaaT algorithm is initiated, and electrical components are ready to be installed and connected to the power system. At block 107, the controller 62 determines whether the next electrical component(s) is/are high current components.

At block 108, if the next electrical component is not a high current component, one or more mid/low current components are connected to the power system, either to the power grid 70 or the power grid 80 (or both if a dual input component is being connected). As each mid/low current component is connected, electrical power is supplied through one or both of the electrical centers 78 and 88. Each current interrupting device 79 and 89 may be individually switched on or off while maintaining power to both grids 70 and 80 (if powered). For example, the controller 62 is a smart electrical center or a zone controller, which can actuate current interrupting devices on a granular basis, still following a specific assembly context (as well as verifying integrity of each connection after complete).

At block 109, the controller 62 verifies the integrity of each mid/low current component. This verification may be performed iteratively as each component is connected during the mid/low current component connection process.

Upon completion of the mid/low current component connection process, the controller 62 determines whether overall system assembly is complete (block 110). If so, the method ends at block 111.

Referring to FIG. 7B, at block 112, if it is determined that one or more high current components is/are to be installed, the controller 62 determines whether the switching assembly 66 includes both of the switches S1 and S2.

At block 113, if both switches S1 and S2 are present (e.g., the switching assembly 66 is configured according to the embodiment of FIG. 2), the controller 62 determines whether a high current component is to be connected to the power grid 70.

At block 114, if the high current component is to be connected to the power grid 70, the controller 62 sends a command to open the switch S1 (the switch S2 is currently closed). If the APM 44 and the A2 conductor are installed and enabled, the A2 conductor may be turned off or disabled.

As noted herein, the method 100 is described according to an embodiment in which the LV power system 40 has only one APM (i.e., the APM 44 is present and the APM 45 is excluded). However, if both the APM 44 and the APM 45 are present, and the APM 45 is installed and/or the A1 conductor is enabled, then the A1 conductor is turned off or disabled.

At block 115, upon opening the switch S1, output at PG1 is disabled, and the power grid 70 is isolated from the battery module 42 at block 116. In this way, power is removed from the power grid 70 so that high current components can be installed while the components and the power grid 70 are unpowered.

At block 117, a high current component is installed and connected to the electrical center 78 of the power grid 70. At block 118, the controller 62 determines whether any additional components are to be connected to the power grid 70. If not, a command is sent to close the switch S1 (block 119) and power is restored to the power grid 70 (block 120).

At block 121, if high current components are to be installed and connected to the power grid 80, the controller 62 determines whether the APM 44 (or a different power source) is installed and connected to the power grid 80.

At block 122, if the APM 44 or other power source is not connected, the controller 62 sends a command to open the switch S2 to isolate the power grid 80. The switch S1 remains closed so that power continues to be supplied to the power grid 70.

At block 123, the switch S2 opens and output at PG2 is disabled, and the power grid 80 is isolated from the battery module 42 at block 124.

At block 125, the high current component is installed and connected to the electrical center 88 of the power grid 80. At block 126, the controller 62 determines whether any additional components are to be connected to the power grid 80. If not, a command is sent to close the switch S2 (block 127) and power is restored to the power grid 80 (block 128).

At block 129, if the APM 44 (or a different power source connected to the power grid 80) is installed and connected to the high voltage battery pack 32, the controller 62 sends a command to open the switch S2 to isolate the power grid 80. The switch S1 remains closed so that power continues to be supplied to the power grid 70.

At block 130, the switch S2 opens and output at PG2 is disabled. At block 131, the controller 62 sends a command to disable the APM's output at the conductor A2 and thereby disconnect the APM 44 from the power grid 80. At block 132, the power grid 80 is isolated from the battery module 42 and the APM 44.

At block 133, the high current component is installed and connected to the electrical center 88 of the power grid 80. At block 134, the controller 62 determines whether any additional components are to be connected to the power grid 80.

If no more high current components are to be connected to the power grid 80, a command is sent to close the switch S2 (block 135). A command is also sent to enable the output from the APM 44 (block 136). Power is thus restored to the power grid 80 (block 137)

The following stages are described in conjunction with an embodiment in which the switch S2 is present and the switch S1 is excluded (as shown in FIG. 5), and the APM 44 is connected to the prefuse center 90 and the power grid 80 via a conductor A2 (shown in FIG. 2).

Referring to FIG. 7C, if only the switches S2 and S3 are present (the switch S1 is not present), the method 100 proceeds from block 112 to block 138 for high current component connections.

At block 139, the APM 44 is connected to the prefuse center 90 to allow for power to be provided via the high voltage battery pack 32, and high voltage contactors are closed at block 140. The APM 44 now provides power through the output at A2 (block 141).

At block 142, the controller 62 determines whether a high current component is to be connected to the power grid 70. If not (i.e., a high current component is to be connected to the power grid 80), the method 100 proceeds to block 129.

At block 143, if a high current component is to be connected to the power grid 70, the controller 62 sends a command to open the switch S3 to disconnect the battery module 42 from both grids 70 and 80. The switch S2 is also opened to isolate the APM 44 from both power grids. Outputs from the battery module at PG1 and PG2 are disabled (block 144).

At this point, there is no power at the power grid 70, and the power grid 80 is powered by the APM 44 via output at A2 (block 145).

At block 146, the high current component is installed and connected to the electrical center 78 of the power grid 70. At block 147, the controller 62 determines whether any additional components are to be connected to the power grid 70. If not, a command is sent to close the switch S3 and the switch S2 (block 148), and power is restored to the power grid 70 (block 149).

Figure 8:
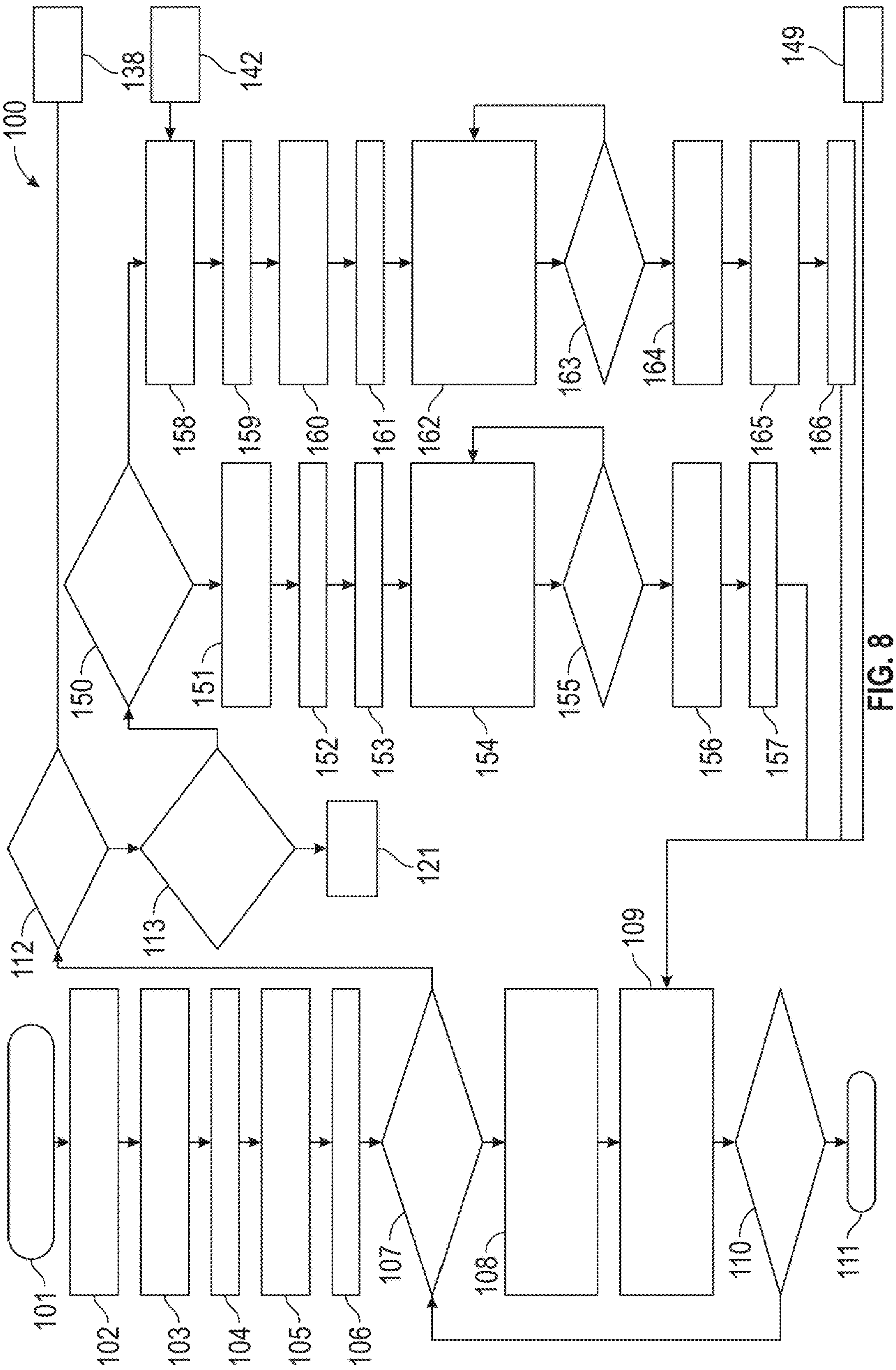
FIG. 8 depicts a flow diagram depicting aspects of a method of testing and/or manufacturing an electrical system, or a method of controlling power to the electrical system during testing and/or manufacturing, in accordance with an exemplary embodiment.

FIG. 8 depicts another embodiment of the method 100. In this embodiment, the LV power system 40 includes an APM for each power grid 70 and 80. This embodiment is discussed in conjunction with the example of the grid isolation system 60 of FIG. 2, but is not so limited. In that example, the grid isolation system 60 includes both the APM 44 and the APM 45.

The method 100 in this embodiment includes additional steps or stages represented by blocks 150-166. The method 100 is not limited to the number or order of steps therein, as some steps represented by blocks 150-166 may be performed in a different order than that described below, or fewer than all of the steps may be performed.

At block 150, if a high current component is to be installed on the power grid 70, the controller 62 determines whether the APM 45 (or a different power source) is installed and connected to the power grid 70.

At block 151, if the APM 45 is not installed, the controller 62 sends a command to open the switch S1 (the switch S2 is currently closed). At block 152, upon opening the switch S1, output at PG1 is disabled, and power is removed from the power grid 70 (block 153).

At block 154, a high current component is installed and connected to the electrical center 78 of the power grid 70. At block 155, the controller 62 determines whether any additional components are to be connected to the power grid 70. If not, a command is sent to close the switch S1 (block 156) and power is restored to the power grid 70 (block 157).

At block 158, if the APM 45 (or a different power source) is installed and connected to the high voltage battery pack 32, the controller 62 sends a command to open the switch S1 to isolate the power grid 70.

At block 159, the switch S1 opens and output at PG1 is disabled. At block 160, the controller 62 sends a command to disable the APM's output at the conductor A1 and thereby disconnect the APM 45 from the power grid 70. At block 161, the power grid 70 is isolated from the battery module 42 and the APM 45.

At block 162, the high current component is installed and connected to the electrical center 78 of the power grid 70. At block 163, the controller 62 determines whether any additional components are to be connected to the power grid 70.

If not, a command is sent to close the switch S1 (block 164), and a command is sent to enable the output from the APM 45 (block 165), thereby restoring power to the power grid 70 (block 166).

Figure 9:
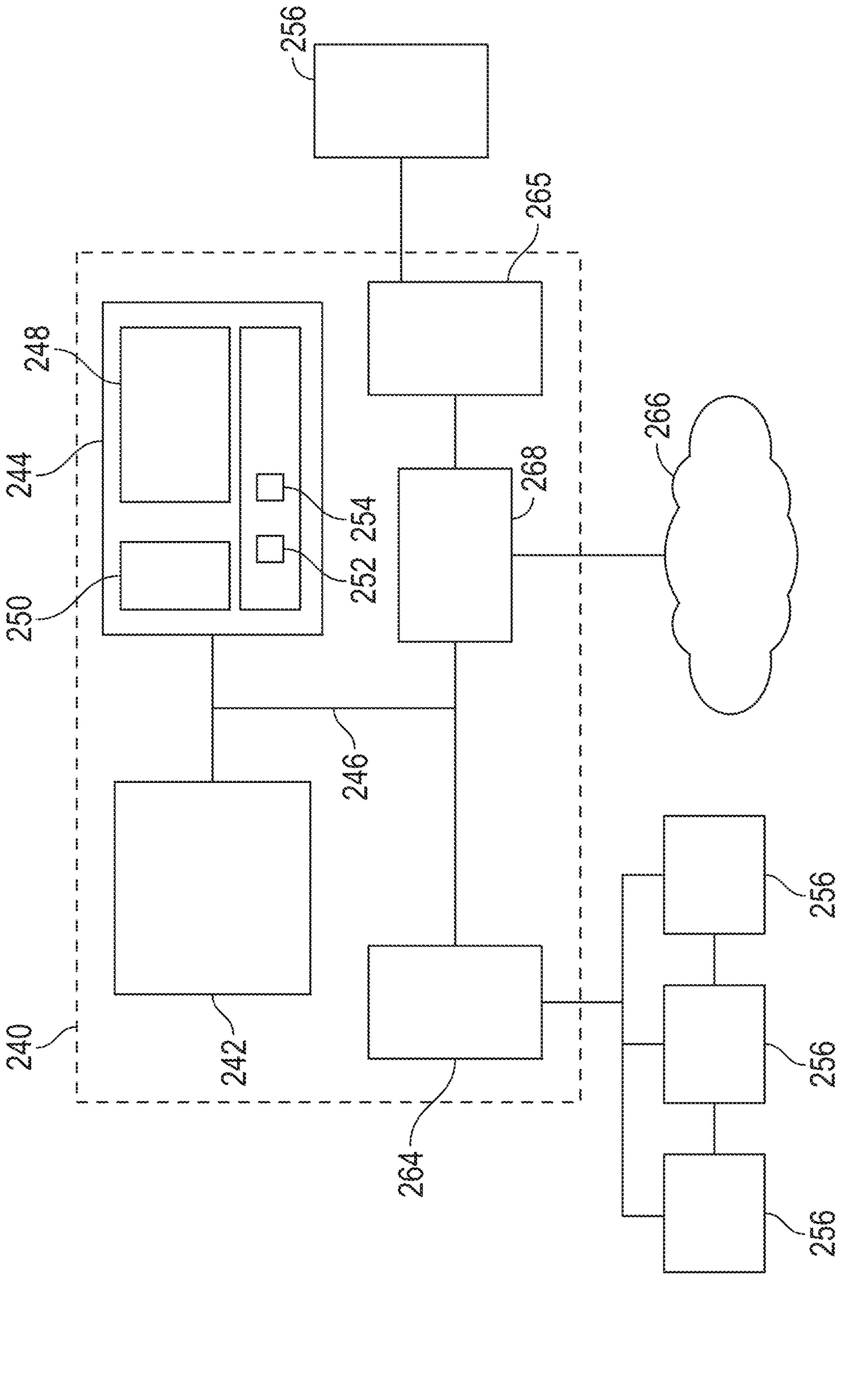
FIG. 9 depicts a computer system in accordance with an exemplary embodiment.

FIG. 9 illustrates aspects of an embodiment of a computer system 240 that can perform various aspects of embodiments described herein. The computer system 240 includes at least one processing device 242, which generally includes one or more processors for performing aspects of image acquisition and analysis methods described herein.

Components of the computer system 240 include the processing device 242 (such as one or more processors or processing units), a memory 244, and a bus 246 that couples various system components including the system memory 244 to the processing device 242. The system memory 244 can be a non-transitory computer-readable medium, and may include a variety of computer system readable media. Such media can be any available media that is accessible by the processing device 242, and includes both volatile and non-volatile media, and removable and non-removable media.

For example, the system memory 244 includes a non-volatile memory 248 such as a hard drive, and may also include a volatile memory 250, such as random access memory (RAM) and/or cache memory. The computer system 240 can further include other removable/non-removable, volatile/non-volatile computer system storage media.

The system memory 244 can include at least one program product having a set (i.e., at least one) of program modules that are configured to carry out functions of the embodiments described herein. For example, the system memory 244 stores various program modules that generally carry out the functions and/or methodologies of embodiments described herein. A module 252 may be included for performing functions related to monitoring, and a module 254 may be included to perform functions related to control of the grid isolation system. The system 240 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 242 can also communicate with one or more external devices 256 as a keyboard, a pointing device, and/or any devices (e.g., network card, modem, etc.) that enable the processing device 242 to communicate with one or more other computing devices. Communication with various devices can occur via Input/Output (I/O) interfaces 264 and 265.

The processing device 242 may also communicate with one or more networks 266 such as a local area network (LAN), a general wide area network (WAN), a bus network and/or a public network (e.g., the Internet) via a network adapter 268. It should be understood that although not shown, other hardware and/or software components may be used in conjunction with the computer system 240. Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A power system comprising:

a first power grid configured to supply power to a first component from a low voltage battery of a vehicle;

a second power grid configured to supply power to a second component from the low voltage battery; and a grid isolation system including:

at least one current interrupting device and a controller configured to operate the current interrupting device to selectively isolate at least one of the first power grid and the second power grid from the low voltage battery;

a first set of circuit protection devices disposed between the low voltage battery and the first power grid;

a second set of circuit protection devices disposed between the low voltage battery and the second power grid, wherein the first set of circuit protection devices and the second set of circuit protection devices are configured to interrupt currents having a current level greater than a first current level threshold; and a prefuse center including a first set of fuses disposed between the low voltage battery and the first set of protection devices, and a second set of fuses disposed between the low voltage battery and the second set of protection devices, wherein the first set of fuses and the second set of fuses are configured to interrupt currents having a current level greater than a second current level threshold, the second current level threshold being greater than the first current level threshold.

2. The system of claim 1, wherein the low voltage battery, the first power grid and the second power grid are part of the vehicle.

3. The system of claim 1, wherein the low voltage battery is part of a battery module including a housing, the at least one current interrupting device disposed in the housing.

4. The system of claim 1, wherein the at least one current interrupting device includes at least one of a first switch configured to selectively connect the low voltage battery to the first power grid, and a second switch configured to selectively connect the low voltage battery to the second power grid.

5. The system of claim 4, wherein the at least one current interrupting device includes the first switch and the second switch.

6. The system of claim 1, wherein the grid isolation system includes a protection switch disposed between the low voltage battery and the at least one current interrupting device, the protection switch configured to be opened to disconnect the low voltage battery from the first power grid and the second power grid.

7. The system of claim 6, wherein the at least one current interrupting device includes at least one of a first switch disposed between the protection switch and the first power grid, and a second switch disposed between the protection switch and the second power grid.

8. The system of claim 1, wherein at least one of the first power grid and the second power grid is configured to supply power to a dual input component.

9. A method of evaluating a power system, comprising:

activating the power system by electrically connecting a low voltage battery to a first power grid and a second power grid, the power system having a grid isolation system that includes at least one current interrupting device and a controller configured to operate the current interrupting device to selectively isolate at least one of the first power grid and the second power grid from the low voltage battery, the grid isolation system including:

the at least one current interrupting device having a first set of circuit protection devices disposed between the low voltage battery and the first power grid, and a second set of circuit protection devices disposed between the low voltage battery and the second power grid, wherein the first set of circuit protection devices and the second set of circuit protection devices are configured to interrupt currents having a current level greater than a first current level threshold; and a prefuse center including a first set of fuses disposed between the low voltage battery and the first set of protection devices, and a second set of fuses disposed between the low voltage battery and the second set of protection devices, wherein the first set of fuses and the second set of fuses are configured to interrupt currents having a current level greater than a second current level threshold, the second current level threshold being greater than the first current level threshold;

acquiring a low voltage electrical component and connecting the electrical component to the first power grid; and testing an electrical connection between the electrical component and the low voltage battery.

10. The method of claim 9, wherein the grid isolation system includes a protection switch disposed between the low voltage battery and the at least one current interrupting device, the protection switch configured to be opened to disconnect the low voltage battery from the first power grid and the second power grid.

11. The method of claim 10, further comprising, based on the electrical component being a high current component, closing the protection switch, or maintaining the protection switch in a closed position.

12. The method of claim 9, further comprising determining whether the electrical component is a high current component or a low current component.

13. The method of claim 12, further comprising, based on the electrical component being a high current component, operating the current interrupting device to isolate the first power grid from the low voltage battery and the second power grid prior to connecting the electrical component to the first power grid.

14. The method of claim 12, wherein the power system includes a high voltage power module connected to a high voltage power source, the high voltage power module selectively connectable to the second power grid and the controller by the at least one current interrupting device.

15. The method of claim 14, further comprising, prior to connecting the electrical component to the first power grid, opening the current interrupting device to isolate the first power grid from the low voltage battery and the second power grid, wherein the high voltage power module provides electrical power to the second power grid during the connecting.

16. The method of claim 9, wherein the low voltage battery, the first power grid and the second power grid are part of a vehicle.

17. A vehicle system, comprising:

a low voltage battery configured to power electrical components of a vehicle;

a first power grid configured to supply power to a first component from the low voltage battery;

a second power grid configured to supply power to a second component from the low voltage battery; and a grid isolation system including:

at least one current interrupting device and a controller configured to operate the current interrupting device to selectively isolate at least one of the first power grid and the second power grid from the low voltage battery;

a first set of circuit protection devices disposed between the low voltage battery and the first power grid;

a second set of circuit protection devices disposed between the low voltage battery and the second power grid, wherein the first set of circuit protection devices and the second set of circuit protection devices are configured to interrupt currents having a current level greater than a first current level threshold; and a prefuse center including a first set of fuses disposed between the low voltage battery and the first set of protection devices, and a second set of fuses disposed between the low voltage battery and the second set of protection devices, wherein the first set of fuses and the second set of fuses are configured to interrupt currents having a current level greater than a second current level threshold, the second current level threshold being greater than the first current level threshold.

18. The vehicle system of claim 17, wherein the low voltage battery is part of a battery module including a housing, the at least one current interrupting device disposed in the housing.

19. The vehicle system of claim 17, wherein the at least one current interrupting device includes at least one of a first switch configured to selectively connect the low voltage battery to the first power grid, and a second switch configured to selectively connect the low voltage battery to the second power grid.

20. The vehicle system of claim 17, wherein the grid isolation system includes a protection switch disposed between the low voltage battery and the at least one current interrupting device, the protection switch configured to be opened to disconnect the low voltage battery from the first power grid and the second power grid.

* * * * *